(12) United States Patent
Chung et al.

(10) Patent No.: US 10,943,822 B2
(45) Date of Patent: Mar. 9, 2021

(54) FORMING GATE LINE-END OF SEMICONDUCTOR STRUCTURES

(71) Applicant: Taiwan Semiconductor Manufacturing Co., Ltd., Hsinchu (TW)

(72) Inventors: Che-Liang Chung, Taoyuan (TW); Che-Hao Tu, Hsinchu (TW); Kei-Wei Chen, Tainan (TW); Chih-Wen Liu, Taoyuan (TW); You-Shiang Lin, Taipei (TW); Yi-Ching Liang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 54 days.

(21) Appl. No.: 15/922,682

(22) Filed: Mar. 15, 2018

(65) Prior Publication Data
US 2019/0287852 A1    Sep. 19, 2019

(51) Int. Cl.
| *H01L 21/768* | (2006.01) |
|---|---|
| *H01L 21/3213* | (2006.01) |
| *H01L 23/532* | (2006.01) |
| *H01L 29/78* | (2006.01) |
| *H01L 23/535* | (2006.01) |

(52) U.S. Cl.
CPC .. *H01L 21/76895* (2013.01); *H01L 21/32139* (2013.01); *H01L 21/7684* (2013.01); *H01L 21/76802* (2013.01); *H01L 21/76879* (2013.01); *H01L 23/535* (2013.01); *H01L 23/53295* (2013.01); *H01L 29/78* (2013.01)

(58) Field of Classification Search
CPC ......... H01L 21/76895; H01L 21/76879; H01L 21/76802; H01L 21/7684; H01L 21/32139; H01L 23/53295; H01L 23/535; H01L 29/78; H01L 29/66545; H01L 21/76224

See application file for complete search history.

(56) References Cited

U.S. PATENT DOCUMENTS

| 9,236,267 | B2 | 1/2016 | De et al. |
|---|---|---|---|
| 9,502,265 | B1 | 11/2016 | Jiang et al. |
| 9,520,466 | B2 | 12/2016 | Holland et al. |
| 9,520,482 | B1 * | 12/2016 | Chang ................. H01L 27/0924 |
| 9,536,738 | B2 | 1/2017 | Huang et al. |
| 9,543,211 | B1 * | 1/2017 | Lu .................... H01L 21/823437 |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |

(Continued)

*Primary Examiner* — Allen L Parker
*Assistant Examiner* — Gustavo G Ramallo
(74) *Attorney, Agent, or Firm* — Seed IP Law Group LLP

(57) ABSTRACT

The current disclosure provides a semiconductor fabrication method that defines the height of gate structures at the formation of the gate structure. A gate line-end region is formed by removing a portion of a gate structure. A resulted recess is filled with a dielectric material is chosen to have a material property suitable for a later contact formation process of forming a metal contact. A metal contact structure is formed through the recess filling dielectric layer to connect to a gate structure and/or a source/drain region.

20 Claims, 12 Drawing Sheets

(56) References Cited

U.S. PATENT DOCUMENTS

| | | | |
|---|---|---|---|
| 2002/0109231 A1* | 8/2002 | Chu | H01L 28/60 257/758 |
| 2007/0120107 A1* | 5/2007 | Hayakawa | H01L 27/2472 257/4 |
| 2009/0291547 A1* | 11/2009 | Schraub | H01L 21/0271 438/514 |
| 2011/0198694 A1* | 8/2011 | Ng | H01L 21/76267 257/347 |
| 2012/0032263 A1* | 2/2012 | Nakazawa | H01L 21/76816 257/347 |
| 2013/0178035 A1* | 7/2013 | Vega | H01L 29/0847 438/300 |
| 2013/0334651 A1* | 12/2013 | Doris | H01L 29/0649 257/506 |
| 2015/0372122 A1* | 12/2015 | Hodo | H01L 21/47573 438/104 |
| 2017/0278750 A1* | 9/2017 | Shinohara | H01L 29/66575 |
| 2018/0033699 A1* | 2/2018 | Zhu | H01L 29/66795 |
| 2018/0356927 A1* | 12/2018 | Sasaki | H01L 27/3276 |
| 2019/0139831 A1* | 5/2019 | Zhu | H01L 21/823481 |

* cited by examiner

FORMING GATE LINE-END OF SEMICONDUCTOR STRUCTURES

TECHNICAL FIELD

This disclosure relates generally to fabricating semiconductor structures, and more particularly, to a process for forming a gate line-end region of a semiconductor structure.

BACKGROUND

Chemical mechanical polishing/planarization (CMP) is a key process for smoothing surfaces of semiconductor wafers through both chemical etching and physical abrasion. A semiconductor wafer is mounted onto a polishing head, which rotates during a CMP process. The rotating polishing head presses the semiconductor wafer against a rotating polishing pad. Slurry containing chemical etchants and colloid particles is applied onto the polishing pad. Irregularities on the wafer surface are removed resulting in planarization of the processed surface/layer of the semiconductor wafer.

Complementary metal oxide semiconductor (CMOS) transistors are building blocks for integrated circuits. A CMOS transistor generally comprises a semiconductor substrate, a channel layer above the semiconductor substrate, a gate oxide layer and a gate stack above the channel layer, and source and drain diffusion regions in the surface of the semiconductor substrate. Contacts are made to the gate stack, and to the source and drain regions of the CMOS transistor. With the advent of high-k dielectric materials as the gate insulating layer in the CMOS process, metal gates may be used in the devices.

As the CMOS transistor dimensions scale down, gate line-end needs to be formed through lithography procedure to achieve line-end cap space. Traditionally, a CMP procedure is done after the gate line-end formation and before the contact processes to form contact structures, e.g., a contact plug structure. The CMP procedure brings about additional fabrication cost and complexity. Further the CMP procedure may remove a top portion of the gate stack. To prepare for this gate height loss due to the CMP procedure, the gate stack needs to be initially formed with a higher height which brings about higher aspect ratio and the related process complexities, costs and/or dimension restrictions.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1A:
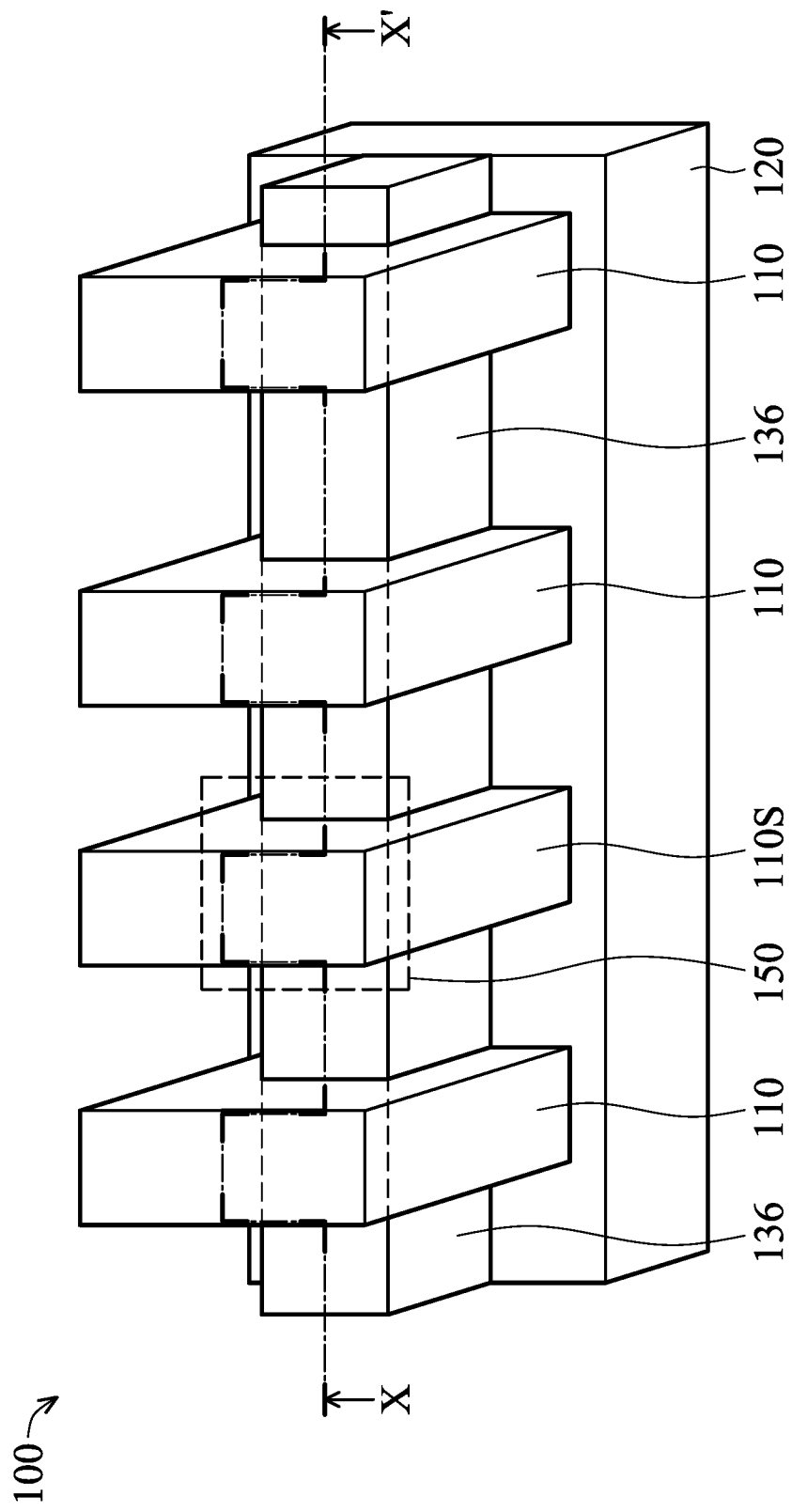
FIGS. 1A and 1B illustrate a plane view and a cross-sectional view of a partially fabricated semiconductor structure with gate structures formed and gate height defined.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor structures, such as CMOS devices, continue to be scaled to smaller sizes to meet advanced performance targets. Fabrication of CMOS devices with such small dimensions involves precise controls. For example, the smaller device size provides lower limits for material loss, which is measured by structure height, and the variation in structure height of a polished surface after a CMP routine. Meanwhile, the size of semiconductor wafers has increased to improve throughput and to reduce cost per die. For example, in the transition from 300 mm to 450 mm wafer size, the wafer area increases by 125%. The uniformity in the smoothness of the whole wafer surface becomes more difficult to maintain with this increasing wafer size.

Due to the extra high density and low device dimensions, after metal gates are formed in a semiconductor structure, some metal gates may need to be removed by etching to form gate line-end regions, for various reasons, e.g., to achieve end cap space or to isolate separate logic active areas through a diffusion break. The recess region resulting from the gate removal is filled with a dielectric film to form a dielectric body about the gate line-end region. Traditionally, a subsequent CMP routine will be performed so that the upper surface of the dielectric body is planar with the remaining metal gates and the extra dielectric film is removed. Due to this CMP routine, some upper portion of the remaining metal gates may be removed and the gate height is defined after this CMP process.

The current disclosure describes techniques for forming semiconductor structures that define the height of the metal gate when the metal gate is formed and achieves the subsequent gate line-end formation without including a CMP operation that alters the height of the metal gate. Specifically, in an example embodiment of the techniques described herein, when filling a gate line-end recess generated after a gate line-end cut, a dielectric material used to fill the gate line-end recess has material properties making it suitable for use in a contact process for forming a metal contact of, e.g., tungsten and/or cobalt contact. The dielectric material used to fill the gate line-end recess may include a combination of a various layers that may be silicon monoxide (SiO), silicon oxynitrocarbide (SiONC), silicon oxycarbide (SiOC), silicon mononitride (SiN) and other dielectrics which are suitable for a damascene process of forming contact plugs of tungsten or cobalt. The stoichiometric ratios of the various dielectrics can be selected based on desired properties. For example, the dielectric material may be suitable for integration in a tungsten or cobalt damascene contact structure and can prevent diffusion of tungsten or cobalt and have sufficient mechanical strength to sustain a CMP. The recess filling dielectric material forms a dielectric layer which is also structurally functional as an extension of the first inter-layer-dielectric layer (ILD0) that exists over the remaining gate structures and thus does not need to be removed, e.g., by a CMP process. In accordance with this described embodiment, a metal contact structure is then formed through the recess filling dielectric layer and connects to a gate structure and/or a source/drain region. In accordance with this described embodiment, the metal contact structure is formed without altering the height of the metal gate. In other words, after formation of the metal contact structure, the height of the metal gate of the semiconductor structure remains unchanged and is equal to the height of the metal gate when originally formed.

As a result of this described process, a semiconductor structure may include a gate structure(s) and a dielectric body about a gate line-end region that each include an upper surface that are in planar alignment with each other. In accordance with embodiments described herein, a dielectric layer overlying the gate structure includes a dielectric material that is the same as the dielectric material of the dielectric body and is formed as a same layer in a same formation process as the dielectric body. The gate line-end cut process and the contact formation process in accordance with embodiments described herein do not affect the height of the remaining metal gates.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1B:
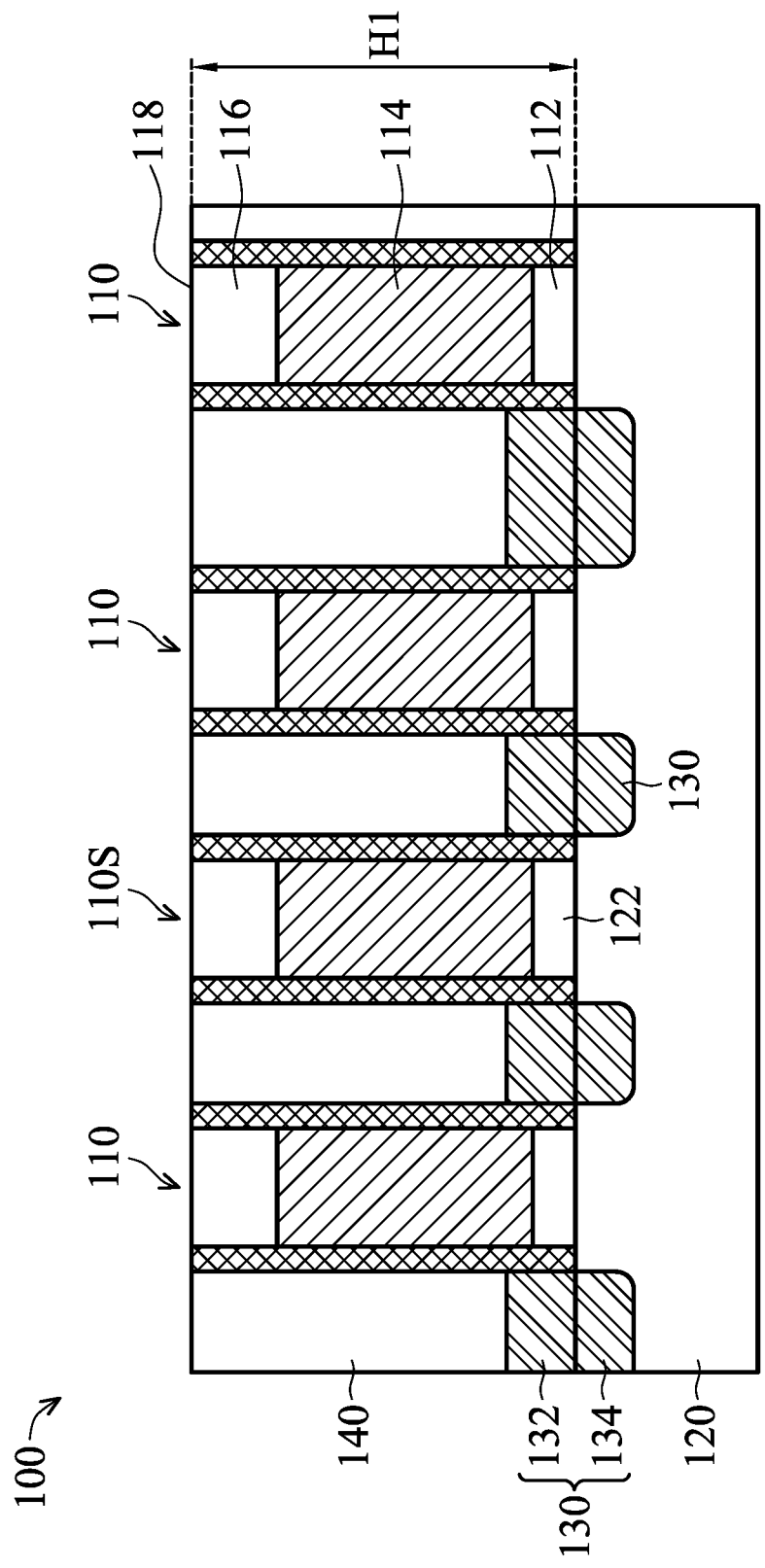

FIGS. 1A and 1B are a plane view and a sectional view of a partially fabricated semiconductor wafer 100 including metal gates 110 with a first gate height H1. FIG. 1B is a sectional view along cross-sectional cutting line X-X' of FIG. 1A. Wafer 100 includes gate structures 110 over substrate 120 and source/drain regions 130, Source/drain regions 130 each may include a first portion 132 above upper surface 122 of substrate 120 and a second portion 134 below upper surface 122 of substrate 120. First portion 132 may be an epitaxial layer formed by epitaxial growth over a fin structure 136 of substrate 120 (illustratively shown in FIG. 1A only). Other FinFET structures are also possible and included in the disclosure. Note that FIG. 1A does not show a source/drain region 130, for simplicity purpose only. First inter-layer dielectric layer (ILD0) 140 is formed over substrate 120 and adjacent to and coplanar with gate structures 110. In subsequent FIGS. 3-9, source/drain regions 130 will be omitted for simplicity.

Substrate 120 may include a silicon substrate in crystalline structure and/or other elementary semiconductors like germanium. Alternatively or additionally, substrate 120 may include a compound semiconductor such as silicon carbide, gallium arsenide, indium arsenide, and/or indium phosphide. Further, substrate 120 may also include a silicon-on-insulator (SOI) structure. Substrate 120 may include an epitaxial layer and/or may be strained for performance enhancement. Substrate 120 may also include various doping configurations depending on design requirements as is known in the art such as p-type substrate and/or n-type substrate and various doped regions such as p-wells and/or n-wells.

As an illustrative example, metal gates 110 are formed with a gate last process such that metal gates 110 are replacement gates. In a replacement gate process, a dummy gate comprising a polysilicon gate and hard mask oxide is formed first. Through techniques of, e.g., photolithography and etching, the dummy gate is then removed and a metal gate structure is formed as a replacement gate.

The following description lists examples of materials for metal gate 110, gate dielectric 112, gate electrode 114, gate cap 116, first inter-layer dielectric layer (ILD0) 140; however, it is understood that other suitable materials that are not listed are within the contemplated scope of the present description. Each metal gate 110 includes a gate dielectric 112, a gate electrode 114 and a gate cap 116. Gate electrode 114 includes a metal or a metal compound. Suitable metal materials for gate electrode 114 include ruthenium, palladium, platinum, tungsten, cobalt, nickel, and/or conductive metal oxides and other suitable P-type metal materials and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. In some examples, gate electrode 114 includes a work function layer tuned to have a proper work function for enhanced performance of the field effect transistor devices. For example, suitable n-type work function metals include Ta, TiAl, TiAlN, TaCN, other n-type work function metal, or a combination thereof, and suitable p-type work function metal materials include TiN, TaN, other p-type work function metal, or combination thereof. In some examples, a conductive layer, such as an aluminum layer, is formed over the work function layer such that the gate electrode 114 includes a work function layer disposed over the gate dielectric 112 and a conductive layer disposed over the work function layer and below the gate cap 116. In an example, gate electrode 114 has a thickness ranging from about 5 nm to about 40 nm depending on design requirements. For example, in the case of high aspect ratio wrap-around gate finFET, gate electrode 114 may have a thickness ranging from about 2 nm to 20 nm on top of fin structure 136 and a thickness ranging from about 5 nm to about 40 nm by the side of the fin structure 136, all in the direction of first gate height H1.

In example embodiments, gate dielectric layer 112 includes an interfacial silicon oxide layer (not separately shown for simplicity), e.g., thermal or chemical oxide having a thickness ranging from about 5 to about 10 angstrom (Å). In example embodiments, gate dielectric layer 112 further includes a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfArO), combinations thereof, and/or other suitable materials. A high K dielectric material, in some applications, may include a dielectric constant (K) value larger than 6. Depending on design requirements, a dielectric material of a dielectric contact (K) value of 7 or higher may be used. The high-K dielectric layer may be formed by atomic layer deposition (ALD) or other suitable technique. In accordance with embodiments described herein, the high-K dielectric layer 112 includes a thickness ranging from about 10 to about 30 angstrom (Å) or other suitable thickness.

Within substrate 120, there may be various isolation regions (not shown for simplicity) such as shallow trench isolation (STI) regions to isolate one or more devices or logic function areas from one another. The STI regions include silicon oxide, silicon nitride, silicon oxynitride, fluoride-doped silicate glass (FSG), and/or a low-K dielectric material or other suitable materials. In accordance with embodiments described herein, other isolation methods and/or features are possible in lieu of or in addition to the STI.

In accordance with example embodiments of the present description, materials for gate cap 116 include a lanthanum oxide or other suitable material. In an example, gate cap 116 has a thickness ranging from about 1 nm to 50 nm depending on design requirements.

In an example, the total height of metal gate 110 ranges from about 8 nm to 60 nm depending on design requirements.

Materials for first inter-layer dielectric layer (ILD0) 140 includes silicon oxide ($SiO_2$), silicon oxynitride, silicon nitride ($Si_3N_4$), silicon monoxide (SiO), silicon oxynitrocarbide (SiONC), silicon oxycarbide (SiOC), silicon mononitride (SiN); and other dielectrics or other suitable materials. ILD0 layer 140 may be formed over substrate 120 and adjacent to by chemical vapor deposition (CVD), high density plasma CVD, spin-on, sputtering, or other suitable approaches, and coplanar with gate structures 110. In an example, ILD0 layer 140 includes a high density plasma (HDP) dielectric and a high aspect ratio process (HARP) dielectric for the gap filling properties thereof. In another example, ILD0 layer 140 includes a dielectric material or a combination of dielectric materials suitable for integration in a damascene process and structure of a contact plug of, e.g., tungsten (W) and/or cobalt (Co). For example, ILD0 layer 140 may include silicon monoxide (SiO), silicon oxynitrocarbide (SiONC), silicon oxycarbide (SiOC), silicon mononitride (SiN).

As shown in FIG. 1A, a gate line-end region 150 is identified by broken lines overlapping a metal gate 110S.

While in FIG. 1A, gate line-end region 150 is shown as overlapping a portion of metal gate 110S, in other embodiment of the present description, gate line end region 150 overlaps a larger or smaller portion of metal gate 110S or overlaps metal gate 110S completely.

Figure 2:
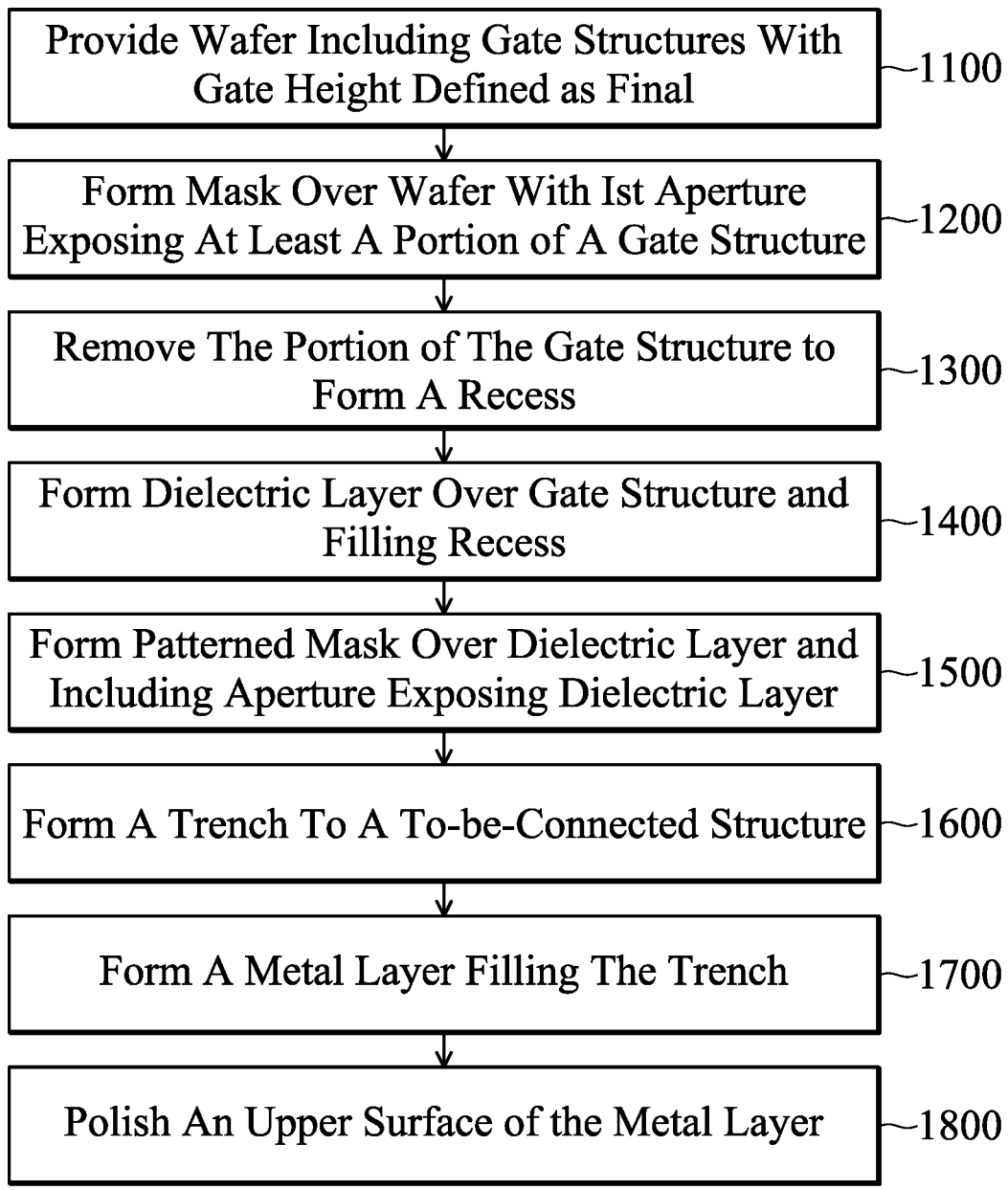
FIG. 2 illustrates an example fabrication process.

Referring to FIG. 2, an example fabrication process for making a gate line-end region and a contact structure thereafter includes operations 1100 to 1800. In example operation 1100, a partially fabricated wafer 100 is provided. The partially fabricated wafer 100 as shown in FIG. 1 includes the gate structure 110 formed and the gate height defined. The gate height of gate structure 110 may be defined by a CMP operation. That is, providing the partially fabricated wafer 100 in operation 1100 may include a CMP operation to define the gate height of gate structure 110. For example, the CMP routine planarizes an upper surface of wafer 100 to establish a first gate height of the plurality of gate structures 110 and to make upper surfaces of gate structures 110 coplanar with an upper surface of first inter-layer dielectric layer 140.

Figure 3:
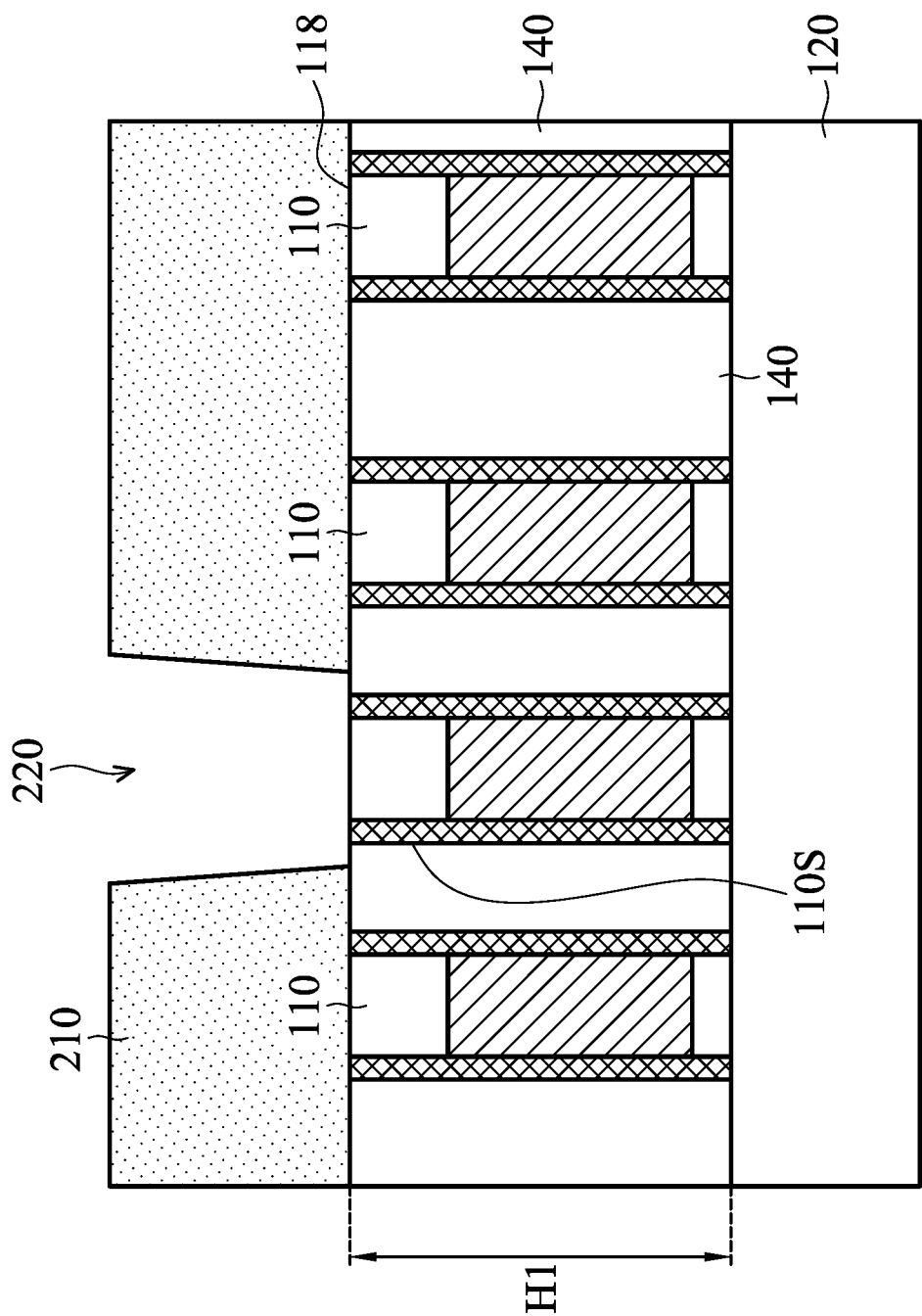
FIGS. 3-9A illustrate cross-sectional views of a semiconductor structure at various stages of fabrication from the structure of FIGS. 1A and 1B and according to example process of FIG. 2.

In example operation 1200, a mask layer is formed overlaying gate structures 110 of wafer 100. The mask layer is patterned to expose at least portion of gate structure 110S that overlaps to be made gate line-end portion 150 (FIG. 1A). With reference also to FIG. 3, mask layer 210 is formed overlying gate structures 110 and patterned to form an aperture 220 that exposes a portion of gate structure 110S. In accordance with this described embodiment, mask layer 210 is a photoresist layer and/or a silicon nitride layer or other suitable material that can be patterned to expose a portion of gate structure 110S and is resistant to the subsequent etching operation. Mask layer 210 may be formed by deposition or growth over gate structures 110. For example, a mask layer 210 of photoresist maybe spin coated, patterned and etched to obtain the aperture 220.

Figure 4:
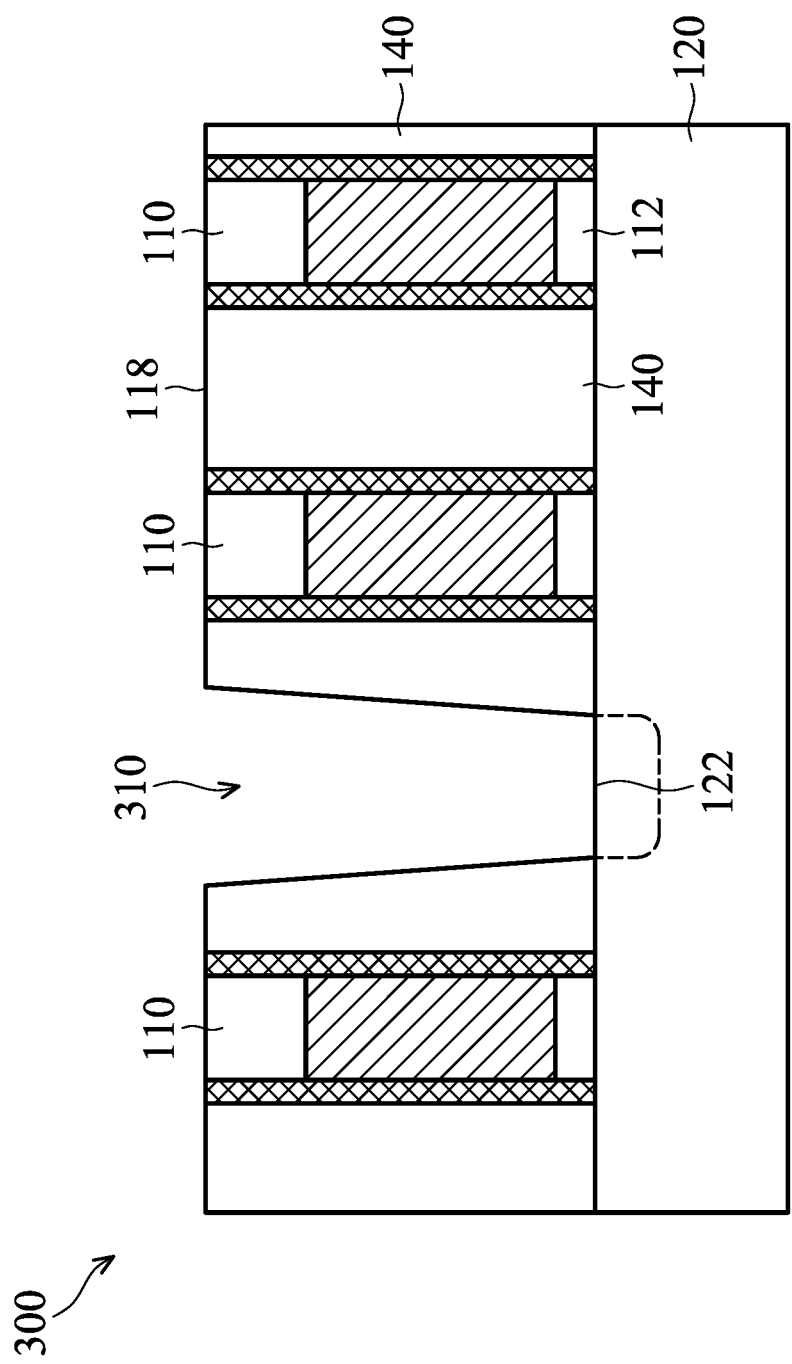

In example operation 1300, with reference also to FIG. 4, a portion of gate structure 110S is removed using an etching process to generate an aperture/recess 310 overlapping gate line-end portion 150 (FIG. 1A). Aperture/recess 310 is formed within first inter-layer dielectric layer 140 through an etching processing that removes a portion of gate structure 110S and optionally also a portion of first inter-layer dielectric layer 140. Suitable etching techniques include general etching techniques or selective etching techniques. In an example, the general etching technique may be time controlled to reach upper surface 122 of substrate 120. Dry etching, e.g., plasma etching or reactive-ion etching, and/or wet etching etchants may be used. In an example, the etching removes gate structure 110S at least to the level of gate dielectric 112 thereof. In an example, the etching forms recess 310 which extends beyond upper surface 122 of substrate 120, as shown with dotted lines in FIG. 4.

In accordance with the presently described embodiment, after aperture/recess 310 is formed, mask layer 210 is removed, e.g., by stripping or other suitable technique. For example, mask layer 210 may be stripped by a solution containing $H_2SO_4$, $H_2O_2$, and/or $NH_4OH$. Before or after such removal of mask layer 210, some additional processes may be conducted to prepare recess/aperture 310 for filling. For example, before filling recess/aperture 310 with dielectric layer 410 as described in the following paragraph, recess/aperture 310 may be filled with one or more liner layers, e.g., of silicon nitride (SiN), and/or hafnium oxide/silicon oxide ($HfO_2/SiO_2$) or other suitable lining layers.

Figure 5:
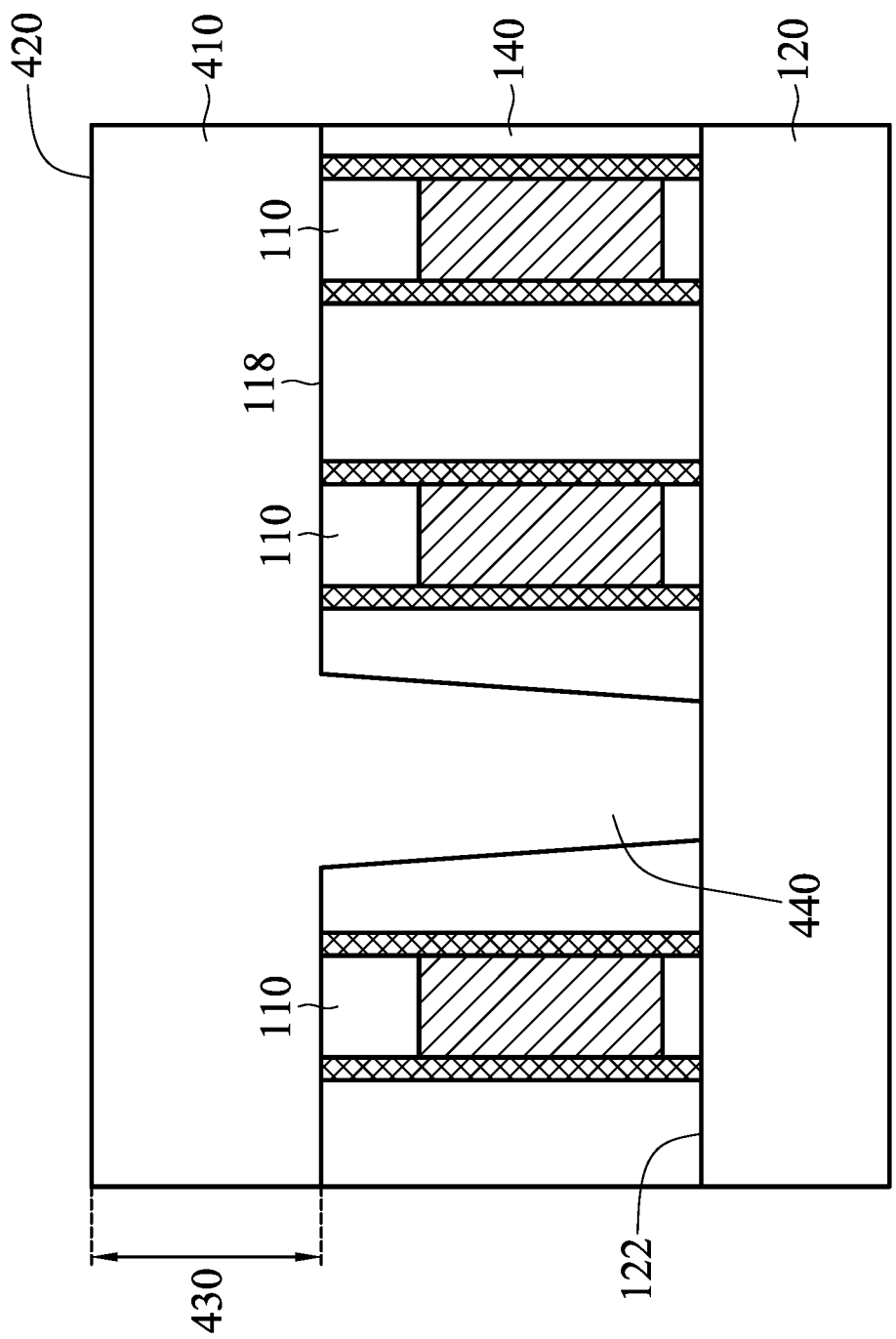

In example operation 1400, with reference also to FIG. 5, a dielectric layer 410 is formed over the remaining gate structures 110 and fills aperture/recess 310 (FIG. 4). Dielectric body 440 is thus formed within recess 310. The material selected for dielectric layer 410 is suitable for integration in a damascene process and structure of a contact plug of, e.g., tungsten (W) and/or cobalt (Co), in a later metal contact formation process. For example dielectric layer 410 includes a dielectric material that has suitable mechanical strength, namely density, to maintain the structural integrity in a CMP process together with a metal, e.g., tungsten or cobalt, of the metal contact plug. Further, dielectric layer 410 includes a dielectric material that resists diffusion of the metal material, e.g., tungsten or cobalt, of a metal contact structure into dielectric layer 410. For example, dielectric layer 410 is silicon nitride ($Si_3N_4$), silicon monoxide (SiO), silicon oxynitrocarbide (SiONC), silicon oxycarbide (SiOC), silicon mononitride (SiN), silicon oxynitride, phosphosilicate glass (PSG), borophosphosilicate glass (BPSG), combinations thereof, or other suitable dielectric material compatible with a tungsten and/or cobalt metal contact formation process and structure. In an example, dielectric layer 410 includes a high density plasma (HDP) dielectric and a high aspect ratio process (HARP) dielectric for their gap filling properties. In an example, dielectric layer 410 includes a dielectric material that is the same as the dielectric material of the first inter-layer dielectric layer (IDL0) 140. When dielectric layer 410 includes the same dielectric material as the first inter-layer dielectric layer 140, dielectric layer 410 is effectively an extension of first inter-layer dielectric layer 140 and is referred to using numeral 410 to denote the time sequence of the deposition of the two dielectric layers 140, 410. Dielectric layer 410 may be formed by chemical vapor deposition (CVD), high density plasma CVD, spin-on, sputtering, or other suitable approaches. If the later metal contact formation process uses metal(s) other than tungsten and/or cobalt, dielectric layer 410 is selected to be a dielectric material that is compatible with the later metal contact formation process.

FIG. 5 shows that an upper surface 420 of dielectric layer 410 is level. The technique used to form dielectric layer 410 can result in upper surface 420 being level; however, if it is not, a planarization process, e.g., a CMP, may be conducted on upper surface 420 and/or an additional leveling/planarization dielectric layer (not shown for simplicity) may be deposited over dielectric layer 410 to provide a level upper surface 420. In accordance with embodiments described herein dielectric layer 410 is not removed, e.g., by a CMP process, down to the upper surface 118 of gate structures 110, accordingly, the thickness 430 of dielectric layer 410 may be selected to meet the design requirements/rules of the final semiconductor structure, including the design requirements/rules for a contact plug structure to a gate 110 or a source/drain region 130 (FIG. 1B). In addition, because the dielectric layer 410 is not removed down to the upper surface 118 of gate structures 110, the height of gate structures 110 remain unchanged and equal to the first height.

Figure 5A:
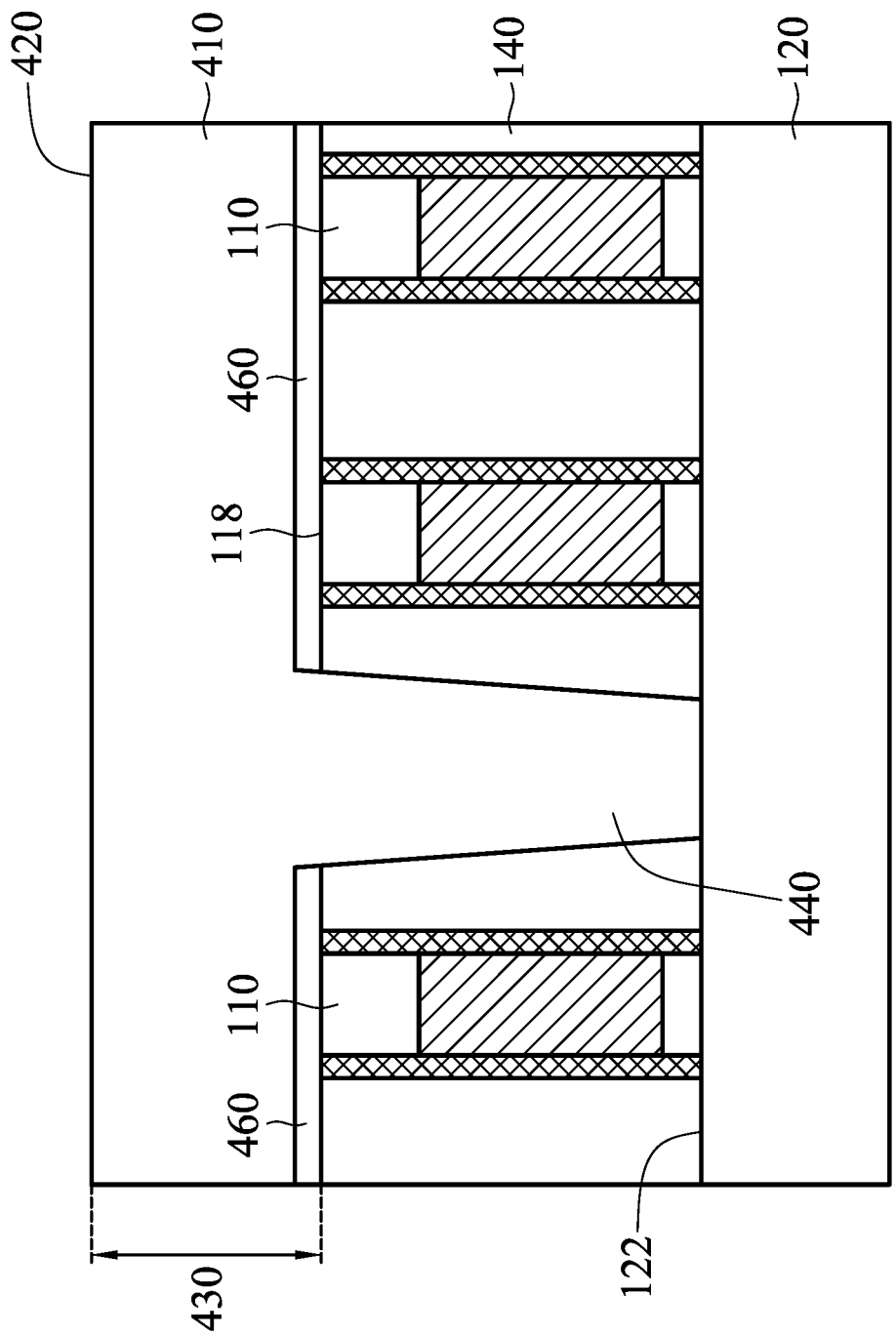

In an embodiment, as shown in FIG. 5A, because the dielectric layer 410 is not removed by a CMP process, or at least not removed down to the upper surface 118 of gate structures 110, any additional layers 460 on top of gate structures 110 and/or first inter-layer dielectric layer 140 remain intact after the formation of the dielectric layer 410 and dielectric body 440. Layer(s) 460 may be an etch stop layer of silicon carbide (SiC) or a laminate of SiC and Silicon Oxycarbide (SiOC). Layer 460 may also be metal patterns. As layer(s) 460 is optional, it may be omitted in other figures for simplicity purposes.

Figure 6:
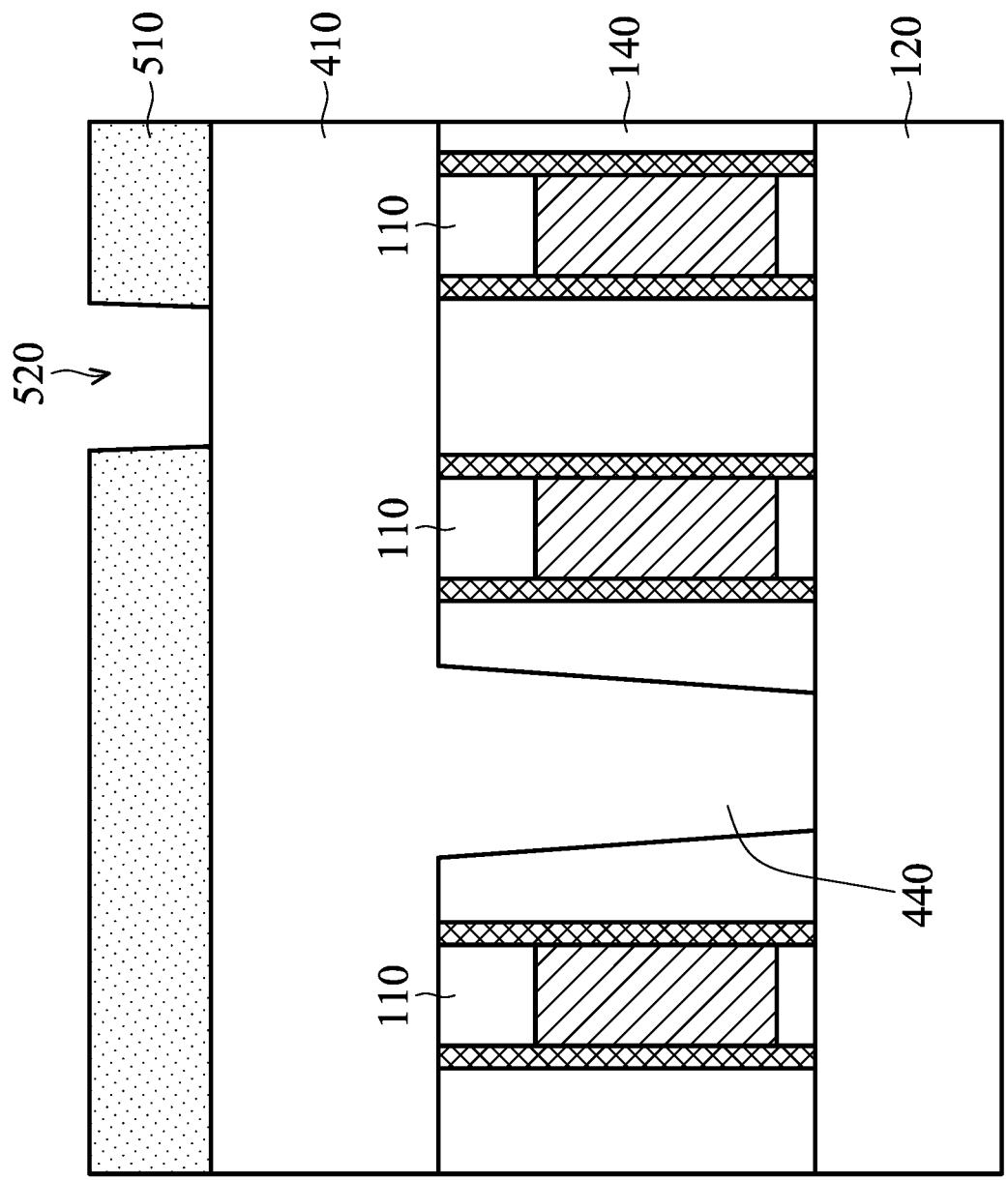

In example operation 1500, with reference also to FIG. 6, a mask layer 510 is formed over dielectric layer 410 and is patterned to form an aperture 520 exposing a portion of dielectric layer 410. Note that dielectric layer 410 is not removed by a CMP polishing and the aperture 520 is formed within dielectric layer 410. Aperture 520 may overlap a location of a to be formed contact structure which will contact at least one of a gate structure 110 or a source/drain region 130 (FIG. 1).

Figure 7:
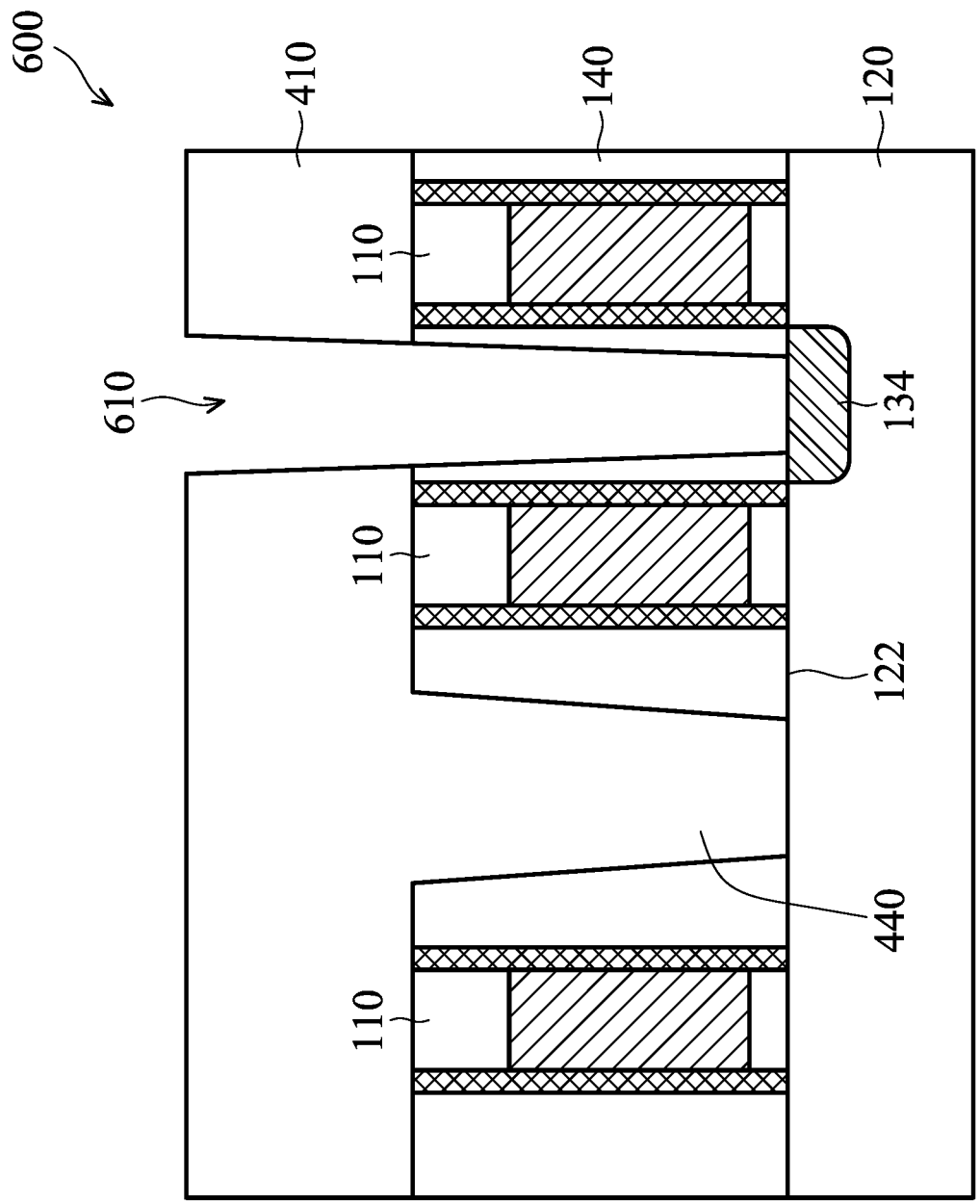

In example operation 1600, with reference also to FIG. 7, an aperture/trench 610 is formed in dielectric layer 410, e.g., using an etching process. In the illustrated embodiment, aperture/trench 610 reaches a desired depth sufficient to expose the structure element, e.g., gate structure or source/drain region, to be connected through a contact structure formed in aperture/trench 610. For example, aperture 610 may expose a gate electrode 114 (FIG. 1B), a lower source/drain portion 134 and/or an upper source/drain portion 132 (shown in FIG. 3 as an illustrative example). FIG. 7 does not illustrate a specific structure element exposed by aperture 610 as the present description is not limited to any specific structure element. In the illustrated embodiment, mask layer 510 is removed, e.g., by stripping, after aperture 610 is formed.

Figure 8:
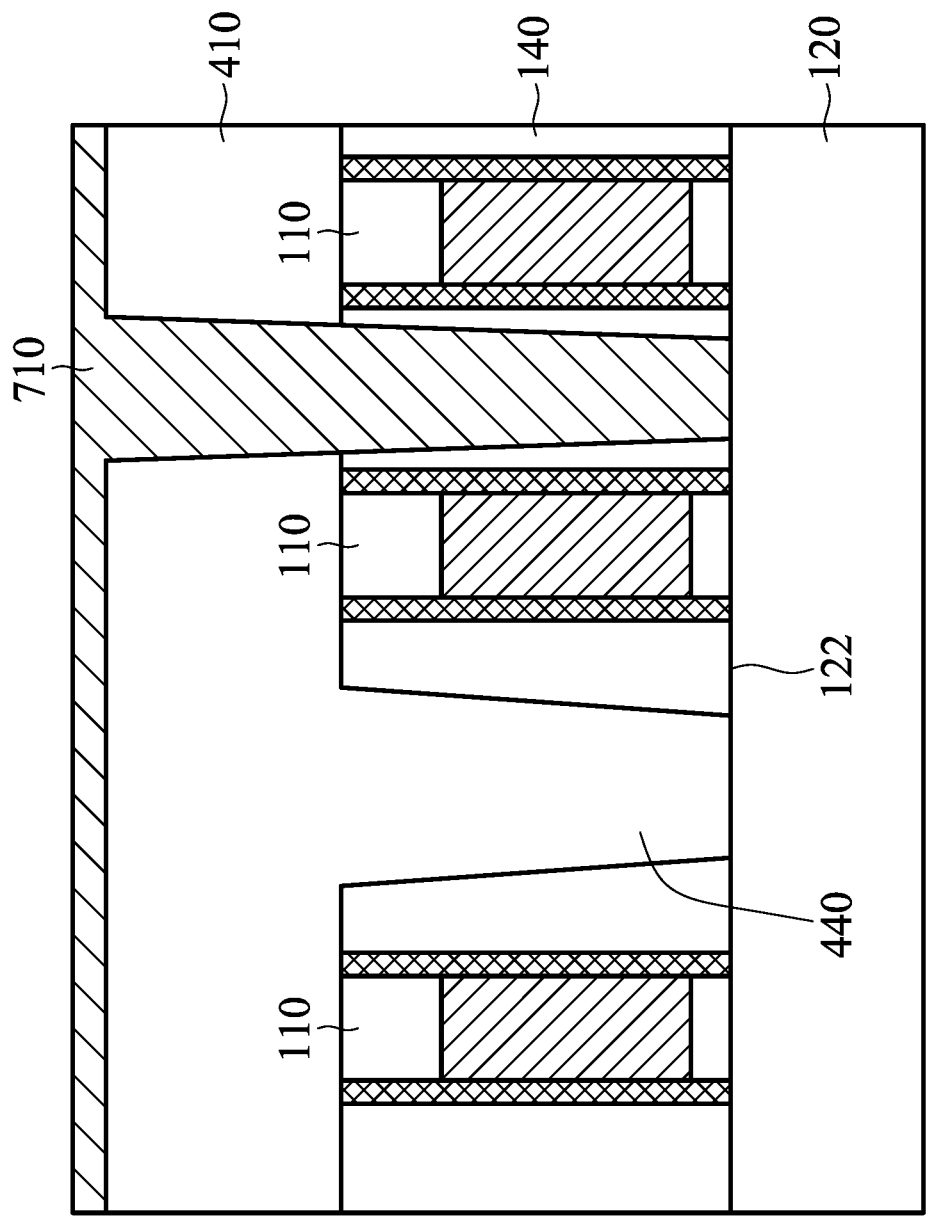

In example operation 1700, with reference also to FIG. 8, a layer of a conductive material, e.g., a metal layer 710, is formed to fill aperture 610. Metal layer 710 is formed of a metal material suitable for forming a contact plug structure or portions thereof, including tungsten (W) and/or cobalt (Co) or other suitable metal materials, like aluminum and/or copper. The deposition of metal layer 710 may be achieved using now known or future developed approaches, e.g., CVD, PVD, plating, or other suitable process.

Figure 9:
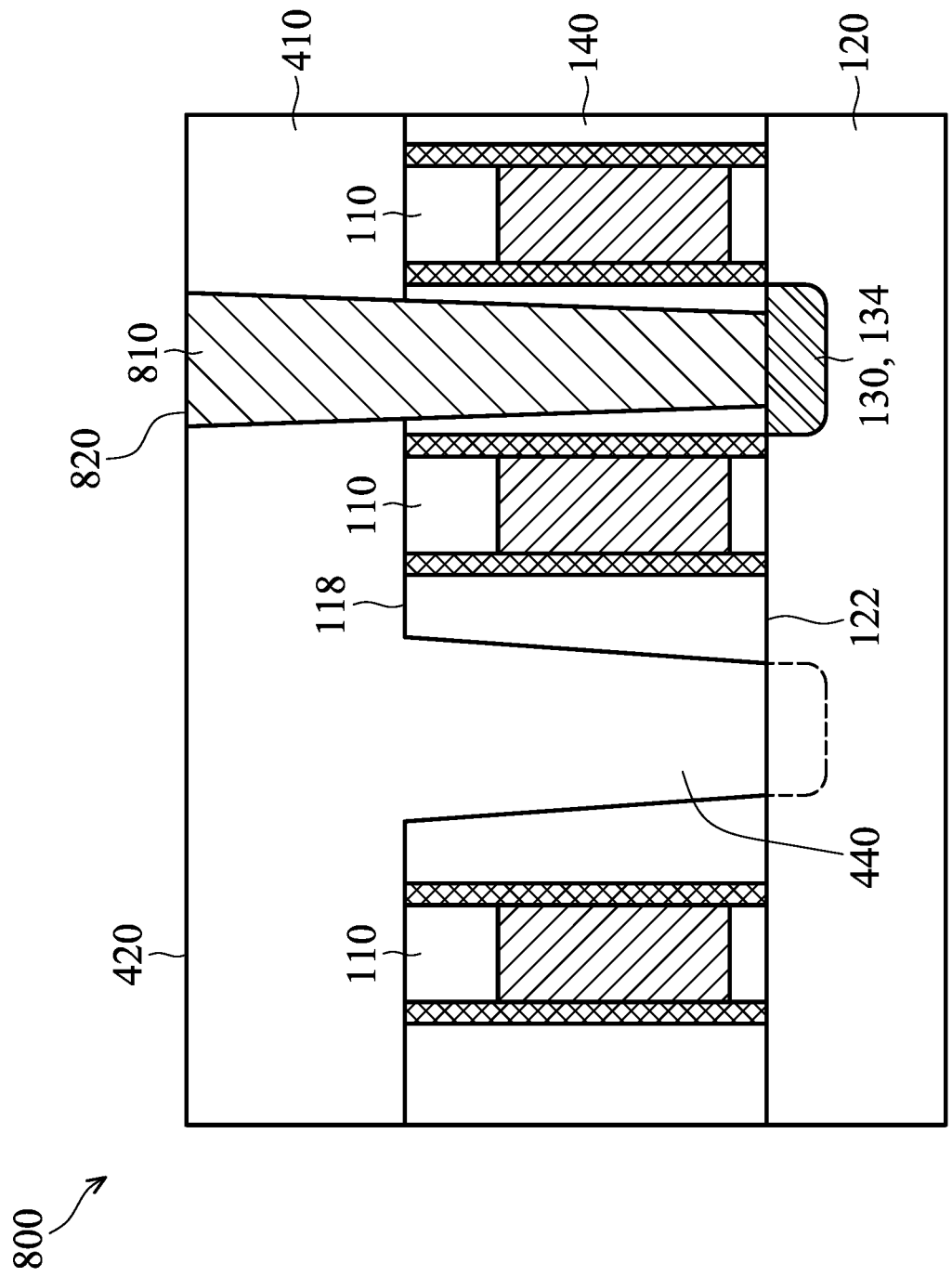

In example operation 1800, with reference also to FIG. 9, a CMP routine is performed on metal layer 710 to define an upper surface 820 of a semiconductor structure 800. As shown in FIG. 9, contact structure 810, shown as a contact plug, is formed through dielectric layer 410 and extends from an upper surface 420 of dielectric layer 410 downward beyond upper surface 118 of first inter-layer dielectric layer 140. FIG. 9 shows, as an illustrative example, that the portion of metal layer 710 overlying dielectric layer 410 has been removed by the CMP operation. This example is not limiting and portions of metal layer 710 that overlie dielectric layer 410 may be patterned and may remain as a metal pattern for various purposes, e.g., a contact pattern.

As shown in FIG. 9, structure 800 includes a substrate 120, one or more gate structures 110, source/drain region 130 at least partially within substrate 120, a first interlayer dielectric layer 140 over substrate 120 and horizontally adjacent to and coplanar with gate structures 110, a second dielectric layer 410 overlying first interlayer dielectric layer 140 and including a dielectric body 440 in coplanar alignment with gate structure 110, a contact structure 810 extending from an upper surface 420 of second dielectric layer 410 downward beyond an upper surface 118 of gate structure 110 and/or first interlayer dielectric layer 140. Second dielectric layer 410 includes a dielectric body 440 about gate line-end portion 150 (FIG. 1A) within first interlayer dielectric layer 140. In an example, as shown in FIG. 9, dielectric body 440 extends to upper surface 122 of substrate 120, which is not limiting. In an example, first inter-layer dielectric layer 140 includes a same dielectric material as second dielectric layer 410 and at least a portion of dielectric body 440. Contact structure 810 connects to at least one of a gate electrode 114 of a gate structure 110 or a source/drain region 130. In an example, dielectric body 440 may extend into substrate 120

(as shown with dotted line) and may function, among others, as a shallow trench insulation region (STI). As shown in FIG. 1, source/drain region 130 may include a first section 132 above upper surface 122 of substrate 120 and a second section 134 below upper surface 122 of substrate 120. Substrate 120 may include a fin structure (not shown for simplicity) and first section 132 of source/drain region 130 may be formed through epitaxial growth over the fin structure.

Figure 9A:
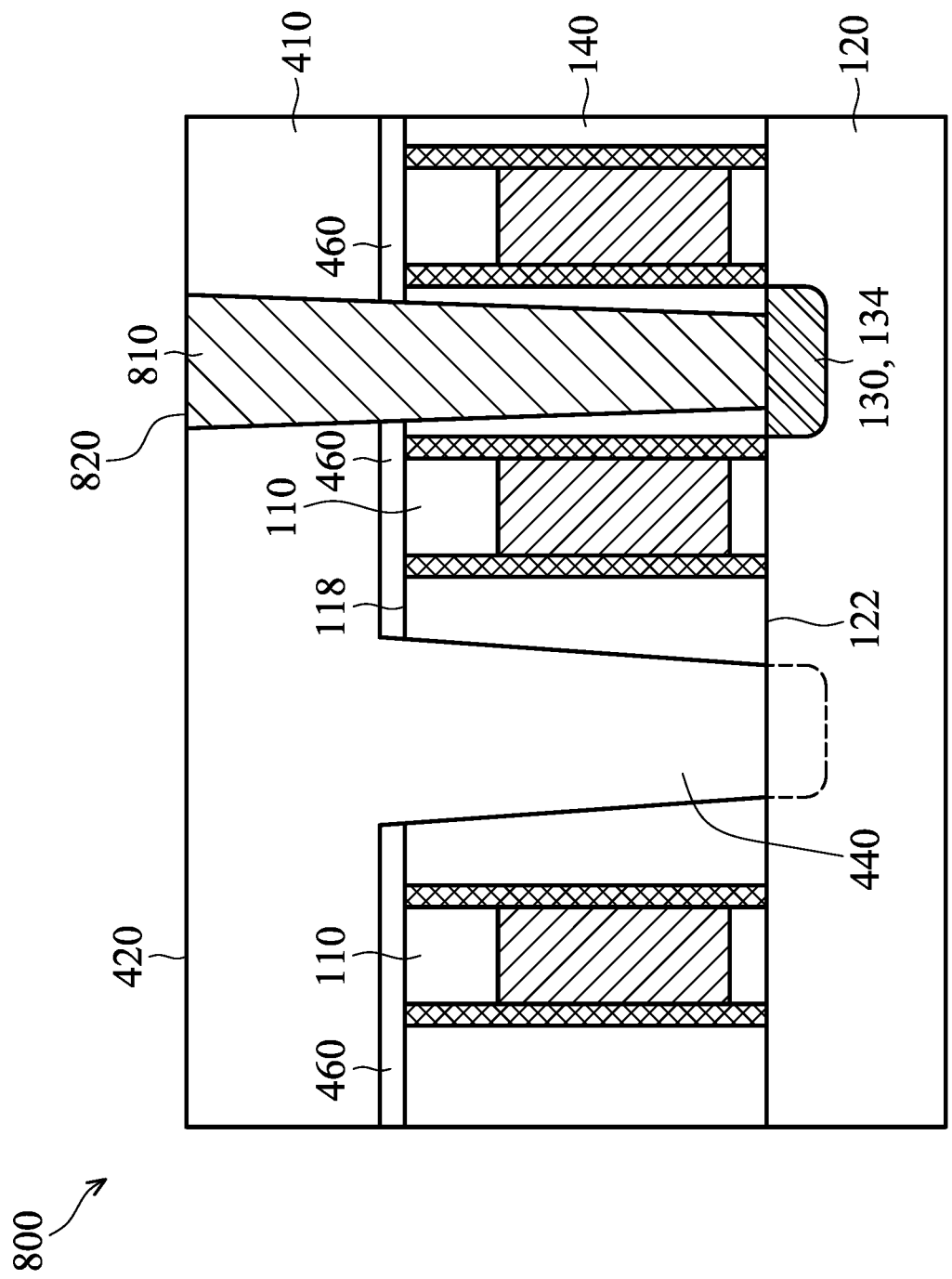

In an embodiment, as shown in FIG. 9A, because the dielectric layer 410 is not removed by a CMP process following the formation of dielectric body 440, portions of additional layer(s) 460 remain on top of upper surface 118 of first interlayer dielectric layer 140 and/or gate structure 110. For example, layer 460 may be an etch stop layer of silicon carbide (SiC) or a laminate of SiC and Silicon Oxycarbide (SiOC).

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The described technique fills a recess after a gate line-end cut process and extends the first inter-layer dielectric layer over the heights of the gate structures using a second dielectric layer that is the same material as the material of the first inter-layer dielectric layer. The second dielectric layer is formed with a thickness suitable for a subsequent contact formation process and is not polished to be coplanar with the gate structures. Therefore, the gate height does not change due to the gate line-end cut process and the subsequent contact formation process. The fabrication process is simplified and the fabrication cost is reduced.

The present disclosure may be further appreciated with the description of the following embodiments:

In an embodiment, a method includes providing a wafer including a substrate, a plurality of gate structures over the substrate, and a first dielectric layer over the substrate. The first dielectric layer is adjacent to and substantially at a same level as, e.g., coplanar with, the plurality of gate structures and the plurality of gate structures is characterized by a first height. A mask layer is formed over the wafer, the mask layer including a first aperture exposing at least a portion of a gate structure of the plurality of gate structures. Portions of the gate structure are removed by etching to form a recess. A second dielectric layer is formed over the first dielectric layer and fills the recess. A conductive, e.g., metal, contact structure is formed that extends from an upper surface of the second dielectric layer downward beyond an upper surface of the first dielectric layer.

In another embodiment, a method includes receiving a semiconductor structure that includes a substrate, a plurality of gate structures over the substrate, a plurality of source/drain regions each at least partially within the substrate, and a first dielectric layer over the substrate and adjacent to the plurality of gate structures. An upper surface of the semiconductor structure is polished and the plurality of gate structures of the polished semiconductor structure each has a first height. A patterned mask layer is formed over the polished upper surface of the semiconductor structure and includes an opening that exposes at least a portion of a gate structure of the plurality of gate structures. A recess is formed by etching the exposed portion of the gate structure at least to a gate dielectric layer of the gate structure. The patterned mask layer is removed and the recess filled with a second dielectric layer that is over the first dielectric layer. A conductive, e.g., metal, contact structure is formed within the second dielectric layer that remains overlying the first dielectric layer.

In further embodiments, after forming the conductive, e.g., metal, contact structure, the height of the plurality of gate structures remains unchanged and is equal to the first height.

In a further embodiment, a semiconductor structure is described and includes a substrate, a gate structure over the substrate, a dielectric body in a coplanar alignment with the gate structure; a source/drain region at least partially positioned within the substrate and a dielectric layer over the gate structure. The dielectric layer includes a dielectric material that is the same as the dielectric material of the dielectric body. The semiconductor structure includes a metal contact structure extending from an upper surface of the dielectric layer to at least one of the gate structure or the source/drain region.

The invention claimed is:

1. A method, comprising:
   providing a wafer including a substrate, a plurality of gate structures over the substrate, and a first dielectric layer over the substrate, the first dielectric layer being adjacent to and at substantially a same level as the plurality of gate structures and the plurality of gate structures having a first height;
   forming a mask layer over the wafer, the mask layer including a first aperture exposing at least a portion of a gate structure of the plurality of gate structures;
   forming a recess in the first dielectric layer by removing a gate electrode of the gate structure exposed through the first aperture, the recess being laterally surrounded by the first dielectric layer;
   forming a second dielectric layer over the first dielectric layer, the second dielectric layer filling the recess; and
   after the forming the second dielectric layer filling the recess, forming a conductive contact structure extending from an upper surface of the second dielectric layer downward beyond an upper surface of the first dielectric layer.

2. The method of claim 1, wherein the providing the wafer includes polishing an upper surface of the wafer to define the first height of the plurality of gate structures.

3. The method of claim 1, further comprising forming a leveling dielectric layer over the second dielectric layer.

4. The method of claim 1, wherein the conductive contact structure includes at least one of tungsten or cobalt.

5. The method of claim 1, wherein the second dielectric and the first dielectric layer include a same dielectric material.

6. The method of claim 1, wherein the forming the conductive contact structure includes:
   forming a second aperture in the second dielectric layer;

filling the second aperture by forming a metal layer over the second dielectric layer; and polishing the metal layer so that an upper surface of the metal layer is substantially at a same level as the upper surface of the second dielectric layer.

7. The method of claim 1, wherein the recess extends downward beyond an upper surface of the substrate.

8. The method of claim 1, wherein the second dielectric layer includes a dielectric material that includes a density suitable for a chemical-mechanical-polishing process together with a metal of the metal contact structure.

9. The method of claim 1, wherein the second dielectric layer includes at least one of silicon monoxide (SiO), silicon oxynitrocarbide (SiONC), silicon oxycarbide (SiOC), and silicon mononitride (SiN).

10. The method of claim 1, wherein a gate structure of the plurality of gate structures includes a conductive electrode of metal or metal compound.

11. The method of claim 1, wherein a gate structure of the plurality of gate structures includes a gate dielectric layer of high dielectric constant.

12. The method of claim 1, wherein after forming the conductive contact structure, the height of the plurality of gate structures equals the first height.

13. A method, comprising:

receiving a semiconductor structure that includes a substrate, a plurality of gate structures over the substrate, a plurality of source/drain regions each at least partially within the substrate, and a first dielectric layer over the substrate and adjacent to the plurality of gate structures;

polishing an upper surface of the semiconductor structure, the plurality of gate structures of the polished semiconductor structure having a first height;

forming a patterned mask layer over the polished upper surface of the semiconductor structure, the patterned mask layer including an opening through which at least a portion of a gate structure of the plurality of gate structures is exposed;

forming a recess in the first dielectric layer by etching out at least a portion of a gate electrode of the gate structure exposed through the opening at least to a gate dielectric layer of the gate structure, the recess being laterally surrounded by the first dielectric layer;

removing the patterned mask layer;

filling the recess with a second dielectric layer, the second dielectric layer overlying the first dielectric layer; and after the filling the recess with the second dielectric layer, forming a conductive contact structure within the second dielectric layer that remains overlying the first dielectric layer.

14. The method of claim 13, wherein the first dielectric layer and the second dielectric layer include a same dielectric material.

15. The method of claim 13, wherein a source/drain region of the plurality of source/drain regions includes an epitaxial layer formed above an upper surface of the substrate.

16. The method of claim 13, wherein after forming the conductive contact structure, the height of the plurality of gate structures equals the first height.

17. A semiconductor structure, comprising:

a substrate;

a gate structure over the substrate and laterally adjacent to a first dielectric layer, the gate structure including a gate electrode and a gate dielectric layer below the gate electrode;

a dielectric body laterally surrounded by the first dielectric layer, the dielectric body extending downward beyond a bottom surface of the gate structure;

a source/drain region;

a second dielectric layer over the gate structure and the first dielectric layer, the dielectric body being an integral part of the second dielectric layer; and a conductive contact structure extending, as an integral structure, from an upper surface of the second dielectric layer through the second dielectric layer and at least partially through the first dielectric layer to the source/drain region.

18. The semiconductor structure of claim 17, wherein the dielectric body includes at least one of silicon monoxide (SiO), silicon oxynitrocarbide (SiONC), silicon oxycarbide (SiOC), and silicon mononitride (SiN).

19. The semiconductor structure of claim 17, wherein the dielectric body extends downward beyond an upper surface of the substrate.

20. The semiconductor structure of claim 17, further comprising an etch stop layer between the first dielectric layer and the second dielectric layer.

* * * * *